United States Patent
Dickman

(10) Patent No.: US 7,145,369 B2
(45) Date of Patent: Dec. 5, 2006

(54) OUTPUT DRIVER FOR AN INTEGRATED CIRCUIT AND METHOD FOR DRIVING AN OUTPUT DRIVER

(75) Inventor: Rory Dickman, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/887,949

(22) Filed: Jul. 9, 2004

(65) Prior Publication Data
US 2005/0030068 A1    Feb. 10, 2005

(30) Foreign Application Priority Data
Jul. 12, 2003    (DE) ................. 103 31 607

(51) Int. Cl.
*H03K 3/00*    (2006.01)
(52) U.S. Cl. ..................... 327/108; 327/112
(58) Field of Classification Search ............... 327/108, 327/112; 326/82–87
See application file for complete search history.

(56) References Cited

U.S. PATENT DOCUMENTS

| | | | |
|---|---|---|---|
| 4,389,715 A | 6/1983 | Eaton, Jr. et al. | |
| 4,627,053 A | 12/1986 | Yamaki et al. | |
| 5,317,573 A | 5/1994 | Bula et al. | |
| 5,859,804 A | 1/1999 | Hedberg et al. | |
| 5,949,249 A * | 9/1999 | Preuss et al. | 326/27 |
| 6,182,262 B1 | 1/2001 | Seyyedy | |
| 6,348,819 B1* | 2/2002 | Ten Pierick et al. | 327/110 |
| 6,374,378 B1 | 4/2002 | Takano et al. | |
| 6,400,177 B1 | 6/2002 | Yoshizaki | |
| 6,421,794 B1 | 7/2002 | Chen et al. | |
| 6,765,432 B1* | 7/2004 | Mitsui | 327/544 |
| 2003/0052369 A1* | 3/2003 | Kajimoto | 257/368 |

FOREIGN PATENT DOCUMENTS

| | | |
|---|---|---|
| DE | 100 34 713 A 1 | 7/2002 |
| DE | 102 37 536 A1 | 4/2003 |
| EP | 1 326 343 A1 | 7/2003 |
| FR | 2 611 301 A1 | 8/1988 |
| JP | 8065138 | 3/1996 |

(Continued)

OTHER PUBLICATIONS

Examination Report Dated Apr. 29, 2004.

(Continued)

*Primary Examiner*—My-Trang Nu Ton
(74) *Attorney, Agent, or Firm*—Patterson & Sheridan, L.L.P.

(57) ABSTRACT

One embodiment of the invention provides an output driver for an integrated circuit. The output driver has a driver circuit for driving an input signal onto an output line. The driver circuit is dimensioned in such a way as to supply a current intensity dependent on the input signal to be driven and/or a potential dependent on the input signal to be driven on the output line. The current value and/or the potential value lie in a current intensity range and/or potential range defined by a predetermined specification. The driver strength of the driver circuit may be set in accordance with a control signal. A measuring circuit is provided to measure the current intensity of the current flowing on the output line and/or the potential of the output line. A control circuit serves for setting the driver strength of the driver circuit so that the potential on the output line is set to a potential value and/or the current intensity is set to a current value, wherein the set potential value and the set current value may lie in a lower power range of the current intensity range and/or potential range prescribed by the specification.

20 Claims, 2 Drawing Sheets

FOREIGN PATENT DOCUMENTS

| | | |
|---|---|---|
| JP | 9261035 | 10/1997 |
| JP | 11027132 | 1/1999 |
| JP | 11214977 | 8/1999 |

OTHER PUBLICATIONS

Robert T. Smith, James D. Chlipal, John M. Bindels, Roy G. Nelson, Frederick H. Fischer and Thomas F. Mantz, *Laser Programmable Redundancy and Yield Improvement in a 64K DRAM*, IEEE Journal of Solid-State Circuits, vol. SC-16, No. 5, Oct. 1981, pp. 506-514.

Satoru Tanoi, Bist: *Required for Embedded DRAM*, International Test Conference, Paper P6.4, P. 1149, IEEE 1998.

Tomoya Kawagoe, Jun Ohtani, Mitsutaka Niiro, Tukasa Ooishi, Mitsuhiro Hamada and Hideto Hidaka, *A Built-In Self-Repair Analyzer (CRESTA) for Embedded DRAMs*, ITC International Test Conference, Paper 21.3 pp. 567-574, IEEE 2000.

German Patent Office Examination Report dated Jun. 15, 2004.

* cited by examiner

OUTPUT DRIVER FOR AN INTEGRATED CIRCUIT AND METHOD FOR DRIVING AN OUTPUT DRIVER

CROSS-REFERENCE TO RELATED APPLICATIONS

This application claims foreign priority benefits under 35 U.S.C. §119 to co-pending German patent application number 103 31 607.8, filed Jul. 12, 2003. This related patent application is herein incorporated by reference in its entirety.

BACKGROUND OF THE INVENTION

1. Field of the Invention

The invention relates to an output driver for an integrated circuit having a driver circuit for driving an input signal onto an output line. The invention furthermore relates to a method for driving an output driver for an integrated circuit.

2. Description of the Related Art

Integrated circuits usually have output drivers for driving signals which have been generated in circuits of the integrated circuit on external lines connected to the integrated circuit. To define the driver behavior of the output drivers, a specification is provided which, depending on the output driver, provides an upper and a lower current value or an upper and lower potential value depending on the signal state (high level or low level) of the output signal to be driven. In this case, the specification respectively specifies an upper and lower current-voltage characteristic curve for the activated pull-up path of the driver circuit and for the pull-down path of the driver circuit, which characteristic curve in each case defines a current intensity range within which the current intensity through the relevant path and thus through the output line must be. Depending on whether a high or low level is intended to be driven by the output driver, the specification prescribes different upper and lower current-voltage characteristic curves for the pull-up path and the pull-down path.

Usually, the specifications for integrated circuits, in particular for SDRAM and DDR memory circuits, provide a relatively large current intensity range or potential range for the output drivers, so that it is simpler to achieve the specification-conforming current intensity values or potential values for process cut-off values, temperatures and voltages (PVT). The specification-conforming current intensity ranges or voltage ranges of the pull-up paths and pull-down paths may signify great differences with regard to the power consumption depending on the position of the actual potential value or current value within the specification, since more power is required in an upper current intensity range and/or in an upper potential range than if the output signal is in a lower range of the permissible predetermined potential window and/or current intensity window.

However, the exact potential value or current value with which the signal is driven with the aid of the output driver cannot be established from the outset since it is necessary to take account of process deviations, temperature fluctuations and voltage fluctuations which might have the effect that the relevant value is outside the specification-conforming window. Moreover, different loads are possible at the outputs of the integrated circuit, so that this may result in different potential values or current values depending on the connected components or the switching states thereof.

SUMMARY OF THE INVENTION

It is an object of the present invention to provide an integrated circuit and a method for controlling an output driver which are able to reduce the power consumption of the integrated circuit and to ensure that the corresponding potential value or current value at the output of the output driver is within the specification.

A first aspect of the present invention provides an output driver for an integrated circuit. The output driver has a driver circuit for driving an input signal onto an output line. The driver circuit is dimensioned in such a way as to supply a current intensity dependent on the input signal to be driven and/or a potential dependent on the input signal to be driven on the output line. The current value and/or the potential value lie in a current intensity range and/or potential range defined by a predetermined specification. The driver strength of the driver circuit may be set in accordance with a control signal. A measuring circuit is provided to measure the current intensity of the current flowing on the output line and/or the potential of the output line. A control circuit serves for setting the driver strength of the driver circuit so that the potential on the output line is set to a potential value and/or the current intensity is set to a current value, wherein the set potential value and the set current value may lie in a lower power range of the current intensity range and/or potential range prescribed by the specification.

In this way, one aspect of the invention provides an output driver for an integrated circuit which makes it possible to set the current value and/or the potential value on the output line in a lower power range, i.e., to operate the integrated circuit at an operating point at which the power consumption of the output driver can be reduced, but without permitting a current value or potential value outside the specification-conforming limits. The current intensity ranges and/or potential ranges permissible in accordance with the specification are comparatively large on account of process fluctuations in the production of the integrated circuits, a high operating temperature range in which the integrated circuit can be operated reliably, and voltage fluctuations that may occur. It follows from this that the output driver has a different power consumption depending on the current intensity or potential within the permissible windows with which the output driver drives a signal onto the output line. Consequently, the range of possible power consumptions is likewise very large on account of the large range of values for the potential and the current intensity. In order not to reach an operating range outside the specification on account of temperature fluctuations, process fluctuations or the like, the driver strength of the output driver may be set by means of the production process such that the input signal to be driven is driven with a current intensity and a potential which essentially lies centrally within the current intensity range or potential range prescribed by the specification.

One aspect of the invention also provides a control circuit which influences the driver strength of the driver circuit. The driver strength of the driver circuit may be set by the control circuit in such a way that the current intensity and/or the potential on the output line, depending on the input signal to be driven, lies in a lower power range of the current intensity range and/or potential range prescribed by the specification, i.e., the power consumption of the output driver is reduced within the permissible range. As a result, it is possible to take into account the process fluctuations during the production of the integrated circuit, the respective operating temperature, the potential fluctuations, e.g., of the supply voltages, and the load connected to the output driver such that the driver circuit of the output driver supplies a potential value and a current intensity value lying within the specification-conforming range limits, albeit in a lower power range to reduce the power consumption of the output driver in comparison with the energy consumption of a noncontrolled driver circuit.

One aspect of the invention provides that the lower power range is determined by a lower current limit value prescribed by the specification and a lower current limit value increased by a tolerance magnitude and/or by a lower potential value prescribed by the specification and a lower potential value increased by a tolerance magnitude. In this way, a lower power range can be defined in the current or potential value prescribed by the specification.

The specification may specify a first maximum and minimum current-voltage characteristic curve for a pull-up path of the driver circuit and a second maximum and minimum current-voltage characteristic curve for a pull-down path of the driver circuit. Depending on the respectively driven pull-up path or pull-down path of the driver circuit, the lower power range is determined depending on the current intensity range which is prescribed by the specification and is specified by the first or second current-voltage characteristic curve.

The control circuit may comprise a comparator device for comparing the measured current value or the measured potential value with a reference current value or a reference potential value dependent on the specification. The reference current value or the reference potential value may be provided by a reference voltage source or a reference current source.

A further aspect of the present invention provides a method for driving an output driver for an integrated circuit having a driver circuit. The driver circuit serves for driving an output signal dependent on an input signal with a current intensity and/or a potential onto an output line. The current intensity of the current flowing on the output line and/or the potential on the output line are measured. The driver strength of the driver circuit is controlled in such a way as to set the current intensity and/or the potential in a current intensity range and/or potential range defined by a predetermined specification. Furthermore, the driver strength is set in such a way that the potential value and/or the current intensity lie in a lower power range of the current intensity range and potential range prescribed by the specification.

The method according to the invention affords the possibility of setting the driver power of an output driver in such a way that the current intensity and/or the potential on the output line are always set in such a way that the power consumption of the driver circuit lies in a lower power range of the current-voltage window prescribed by the specification. The power consumption of the output driver can thereby be reduced. Furthermore, the output driver can be controlled in this way such that it can also react to influences of the load applied to the output driver on the potential value of the output signal and always sets the current intensity or the potential on the output line such that it lies within the specification-conforming current-voltage window of the driver circuit.

The control of the driver strength of the driver circuit may be carried out continuously, periodically or in accordance with a setting signal.

BRIEF DESCRIPTION OF THE DRAWINGS

A preferred embodiment of the invention is explained in more detail with reference to the accompanying drawings, in which.

DETAILED DESCRIPTION OF THE PREFERRED EMBODIMENT

Figure 1:
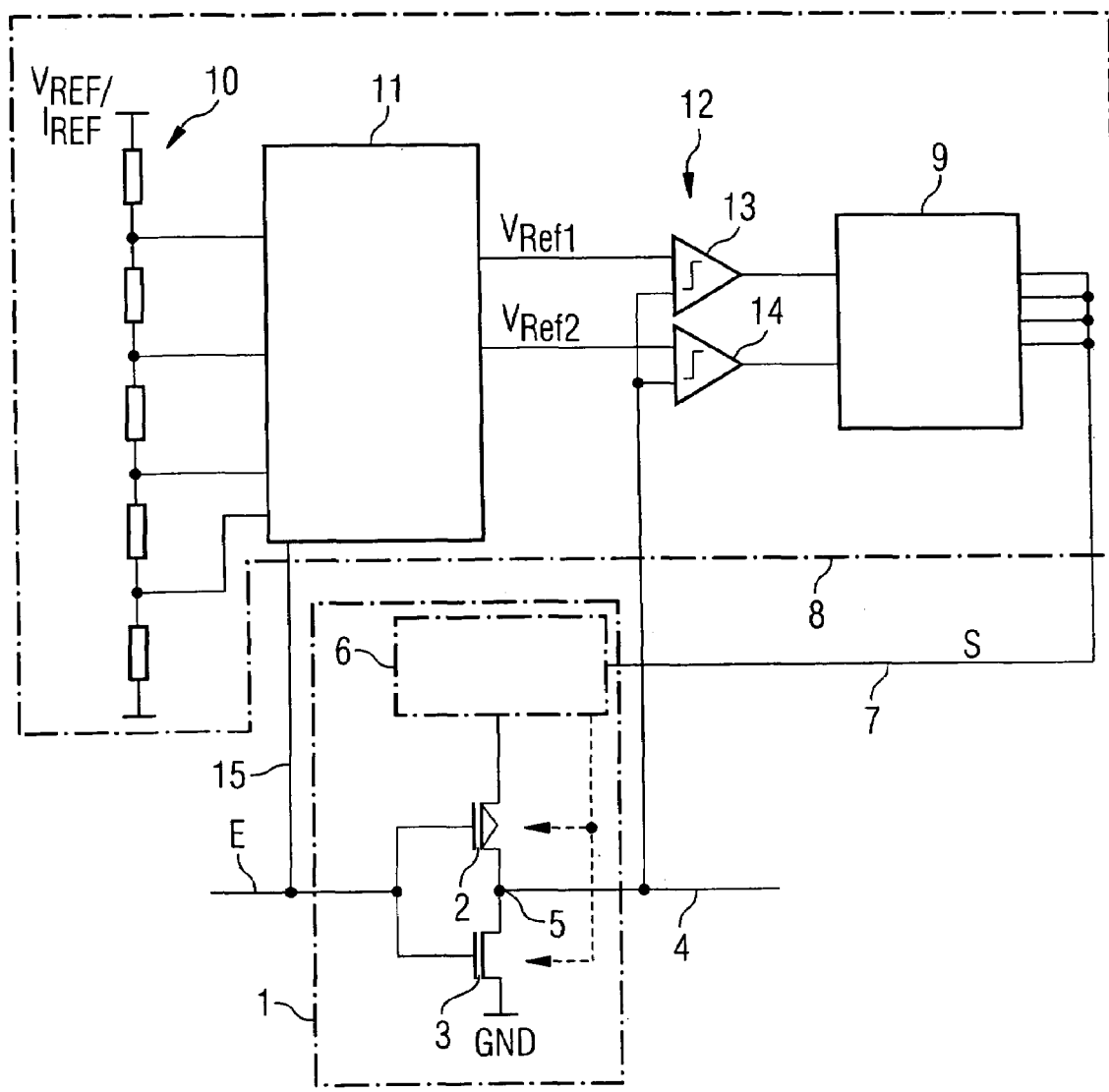
FIG. 1 shows a block diagram of an output driver according to one embodiment of the invention.

FIG. 1 illustrates a block diagram of an output driver according to one embodiment of the invention. The output driver has a driver circuit 1 comprising a p-channel transistor 2 and an n-channel transistor 3. An input signal E is applied to control inputs of the p-channel transistor 2 and of the n-channel transistor 3, which input signal is driven in inverted fashion onto an output line 4 connected to an output 5 of the driver circuit 1.

A first terminal of the p-channel transistor 2 is connected to a high supply potential. A second terminal of the p-channel transistor 2 is connected to a first terminal of the n-channel transistor 3, and a second terminal of the n-channel transistor 3 is connected to a low supply potential, e.g., a ground potential GND.

The driver circuit 1 furthermore comprises a setting circuit 6, by means of which the driver strength of the driver circuit 1 can be set in accordance with a control signal S on a control line 7. The driver strength may be set, for example, by enlarging or decreasing the active area of the p-channel transistor 2 and of the n-channel transistor 3 in a manner dependent on the control signal S. Alternatively, a plurality of such circuits, each having a p-channel transistor and an n-channel transistor, may be connected in parallel to jointly drive an input signal present at the circuits' respective control inputs onto the output line 4. Other possibilities are also conceivable for providing a setting circuit 6 such that the driver strength of an output stage connected thereto can be set in a manner dependent on a control signal.

The output line 4 of the driver circuit 1 is connected to a control unit 8. The control unit 8 is configured to evaluate the potential value on the output line 4 in accordance with predetermined reference values and to generate the control signal S utilized to drive the driver circuit 1. The control unit 8 is also configured to correspondingly adapt the driver strength of the driver circuit 1 if the potential of the respective output signal that is present on the output line lies above or below a range defined by reference potentials.

In the exemplary embodiment illustrated, the control unit 8 includes a comparator unit 12 comprising a first comparator 13 and a second comparator 14. A first reference potential $V_{Ref1}$ provided by a multiplexer 11 is applied to the first comparator 13 and a second reference potential $V_{Ref2}$ is applied to the second comparator 14. The first and second reference potentials $V_{Ref1}$, $V_{Ref2}$ define a potential range within which the potential on the output line 4 is intended to lie. Outputs of the first comparator 13 and of the second comparator 14 are connected to an evaluation unit 9, which generates the control signal S at an output and makes it available to the setting circuit 6 of the driver circuit 1. If the potential on the output line 4 lies above the potential prescribed by the first reference potential value $V_{Ref1}$, then the evaluation unit 9 generates a control signal that specifies to the driver circuit 1 that the driver strength be reduced. If the potential value on the output line 4 is less than the second reference potential value $V_{Ref2}$, then the evaluation unit 9 generates a control signal that indicates to the driver circuit 1 that the driver strength be increased. In this way, the potential value on the output line 4 can be regulated to a driver strength which enables the potential value on the output line 4 to be put into a potential window defined by the first reference potential value $V_{Ref1}$ and the second reference potential value $V_{Ref2}$.

Since the potential value on the output line 4 depends on the input signal E present, the input line connected to the input of the driver circuit 1 is connected via a connecting line 15 to the control unit 8, in particular to the multiplexer 11. In this way, the multiplexer 11 may apply the first and second reference potential values $V_{Ref1}$, $V_{Ref2}$ to the comparator unit 12 in such a way that corresponding selected reference potential values are specified depending on the signal level of the output signal to be output on the output line 4. For this purpose, essentially four reference potentials may be prescribed for the multiplexer 11, two respectively prescribing the desired potential value range for a high level and the respective other two reference potentials prescribing the potential value range for the low level of the output signal. The reference potentials may be provided by a voltage divider 10, for example, to which a reference supply voltage $V_{Ref}$ or a reference supply current $I_{Ref}$ is applied. The reference potentials for defining the potential window for the high level of the output signal are chosen such that they lie within a lower range of the potential window permitted by the specification for the high level of the output signal on the output line 4. The potential window for the low level of the output signal on the output line 4 is defined by the reference potentials such that it likewise lies within a lower range of the potential window prescribed by the specification for the low level of the output signal.

The evaluation unit 9 may be designed as a counter, for example, wherein the control signal is transmitted to the setting circuit 6 as a digital value of the counter reading or wherein the counter value is converted into an analog voltage signal which is provided to the setting circuit 6 as a control signal.

The first comparator 13 and the second comparator 14 are configured in such a way that, at the output of the first comparator 13, a logic "1" is present if the potential on the output line 4 exceeds the first reference potential $V_{Ref1}$, and a logic "0" is present if the potential on the output line 4 falls below the first reference potential $V_{Ref1}$. Equally, at the output of the second comparator 14, a logic "1" is present if the potential on the output line 4 falls below the second reference potential $V_{Ref2}$ and a logic "0" is present if the potential on the output line 4 exceeds the second reference potential $V_{Ref2}$.

The counter in the evaluation unit 9 is decremented if a logic "1" is present at the output of the first comparator 13, and incremented if a logic "1" is present at the output of the second comparator 14. If a logic "0" is present at both outputs of the comparators 13, 14, then the counter reading of the counter in the evaluation unit 9 is not altered.

The first and second reference voltages are prescribed such that the range formed by the first and second reference voltages $V_{Ref1}$, $V_{Ref2}$ lies within a lower range of the permitted potential window prescribed by the specification. The reference voltages $V_{Ref1}$, $V_{Ref2}$ are selected by the multiplexer 11 depending on whether a high level or a low level is intended to be output at the output 5 of the driver circuit 1. For this purpose, by way of example, the input signal may be connected to the multiplexer 11. Alternatively, the output signal on the output line 4 may be connected to the multiplexer 11. By means of the voltage divider 10, reference voltages are made available such that, in each case, two of the reference voltages may be selected by means of the multiplexer 11 to define a voltage range which determines a lower power range within the permissible current-voltage window for the output signal on the output line.

As an alternative, instead of the potential on the output line, a current may also be converted into a measurement voltage, e.g., with the aid of a measuring resistor or another current measuring method, and the measurement voltage may then be compared with the reference potentials made available. It is also possible for the two setting methods to be combined with one another in that both the potential and the current intensity on the output line 4 are measured and evaluated either by two separate comparator circuits or successively with the aid of the reference potentials made available.

Figure 2A:
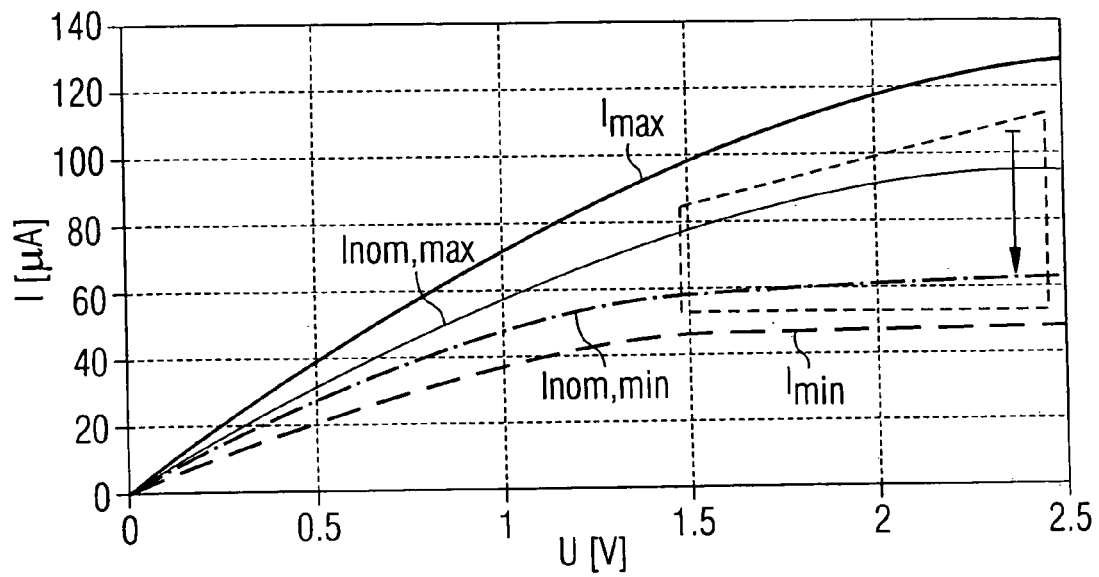
FIGS. 2a, 2b show minimum and maximum current-voltage characteristic curves for illustrating the current-voltage windows for the pull-down path and the pull-up path of the driver circuit.
Figure 2B:
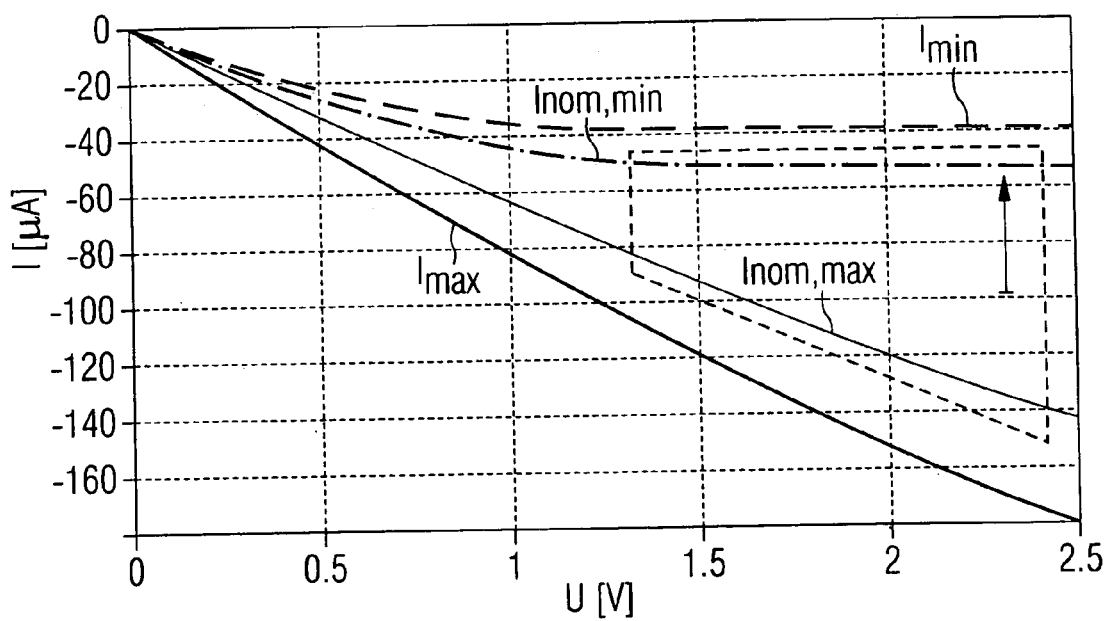

FIGS. 2a and 2b show the switching behaviors of the n-channel transistor 3 in the pull-down path and of the p-channel transistor 2 of the driver circuit 1 in the pull-up path. The current-voltage characteristic curves define a range that is permissible in accordance with the specification. The permissible potential ranges for the high and low levels on the output line are thereby determined. The range is defined in accordance with the lower current-voltage characteristic curve, identified by $I_{min}$, and the upper current-voltage characteristic curve, identified by $I_{max}$. The current-voltage characteristic curves identified by $I_{nom,max}$ and $I_{nom,min}$ represent nominal values of the respective transistor 2, 3. The driver power is principally determined by the current driver capability of the n-channel and p-channel transistors.

In accordance with the specification, an output current may be provided in the current-voltage window defined by the lower and upper current-voltage characteristic curves. The less current flows on the output line, however, the lower the power consumption of the driver circuit 1. A reduction of the power consumption through a reduction of the current intensity through the activated transistor is permissible as long as the current intensity is within the respective current-voltage window prescribed by the specification. It is thus possible, within the limits prescribed by the specification, to define a current intensity range which brings about minimal power consumption through the driver circuit 1. This range is chosen to lie within the range prescribed by the current-voltage windows.

The range may be defined, for example, in that a tolerance magnitude is added to the minimum current intensity $I_{min}$ prescribed for a state of the output signal in accordance with the lower current-voltage characteristic curve, and the corresponding lower power range is thereby defined. Equally, provision may be made for providing a certain distance between the lower power range and the minimum current intensity value, so that the lower current/voltage characteristic curve is not undershot during regulation.

The adaptation of the driver strength of the driver circuit 1 may take place continuously or at periodic time intervals. It is expedient for the setting of the driver strength not to be carried out continuously, since the control unit 8 also has a power consumption which might minimize or cancel the power saving. The driver strength may also be adapted in accordance with an adaptation signal at predetermined points in time.

What is claimed is:

1. An output driver for an integrated circuit, comprising:
   a driver circuit for driving an input signal of the output driver onto an output line;
   a measuring circuit for measuring at least one of an output line current and an output line potential; and
   a control unit for providing a control signal for setting a driver strength of the driver circuit to provide at least one of the output line potential and the output line current in a desired power range of a specification-prescribed potential range and a specification-prescribed current range, wherein the control unit includes a feedback control to affect the setting of the driver strength based on a measured value provided by the measuring circuit.

2. The output driver of claim 1, wherein the desired power range is determined by one of a specification-prescribed lower current limit value, a specification-prescribed lower current limit value adjusted with a tolerance magnitude, a specification-prescribed lower potential limit value and a specification-prescribed lower potential limit value adjusted with the tolerance magnitude.

3. The output driver of claim 1, wherein the driver circuit includes a pull-up path defined by a first maximum and minimum current/potential (I/V) characteristic curve and a pull-down path defined by a second maximum and minimum I/V characteristic curve and wherein the desired power range is determined depending on respectively activated pull-up path and pull-down path of the driver circuit.

4. The output driver of claim 1, wherein the desired power range corresponds to a lower portion of the specification-prescribed potential range and a lower portion of the specification-prescribed current range.

5. The output driver of claim 1, wherein the driver circuit further comprises a setting circuit for receiving the control signal from the control unit and for setting the driver strength of the driver circuit.

6. The output driver of claim 1, wherein the control unit further comprises a comparator unit for comparing at least one of the measured output line current and the measured output line potential respectively with at least one of a reference current value and a reference potential value.

7. The output driver of claim 6, wherein the control unit further comprises an evaluation unit connected to the comparator unit, the evaluation unit configured to change the control signal based upon a result from the comparator unit.

8. The output driver of claim 7, wherein the evaluation unit comprises a counter.

9. The output driver of claim 6, wherein the control unit further comprises a multiplexer connected to provide a first reference potential and a second reference potential to the comparator unit.

10. The output driver of claim 9, wherein the multiplexer selects the first reference potential and the second reference potential supplied to the comparator unit based on the input signal.

11. The output driver of claim 10, wherein the multiplexer includes an input connected to the input signal of the driver circuit, and wherein the input signal is utilized to determine whether a high level or a low level is to be output by the driver circuit.

12. The output driver of claim 9, wherein the multiplexer selects the first reference voltage and the second reference voltage supplied to the comparator unit based on an output signal on the output line.

13. The output driver of claim 9, wherein the control unit further comprises a voltage divider connected provide a plurality of reference potentials selectable by the multiplexer.

14. A method for driving an output driver for an integrated circuit having a driver circuit driving an input signal onto an output line, comprising:
    measuring at least one of an output line current and an output line potential; and
    controlling a driver strength of the driver circuit to set at least one of the current and the potential in at least one of a specification-prescribed current range and a specification-prescribed potential range, respectively, wherein the driver strength is set such that the potential and the current intensity lie in a lower power range of the specification-prescribed current range and the specification-prescribed potential range, and wherein the driver strength is feedback-controlled based on a measured value provided by a measuring circuit.

15. The method of claim 14, wherein the driver strength of the driver circuit is controlled in a manner selected from continuously, periodically and in accordance with a setting signal.

16. The method of claim 14, further comprising:
    comparing at least one of the measured output line current and the measured output line potential respectively with at least one of a reference current value and a reference potential value; and
    changing a control signal for setting the driver strength supplied to the driver circuit based upon a result from the comparison.

17. The method of claim 16, further comprising:
    determining whether a high level or a low level is to be output by the driver circuit based on the input signal; and
    selecting a first reference voltage and a second reference voltage from a plurality of voltage references to be compared against the measured output line potential, the first reference voltage and the second reference voltage selected based on the determination of high level or low level.

18. An output driver for an integrated circuit, comprising:
    a driver means for driving an input signal of the output driver onto an output line; and
    a control means for providing a control signal for setting a driver strength of the driver means to provide at least one of an output line potential and an output line current in a lower power range of a specification-prescribed potential range and a specification-prescribed current range, the control means comprising:
        a comparator means for comparing at least one of the output line current and the output line potential respectively with at least one of a reference current value and a reference potential value; and
        an evaluation means for changing the control signal based upon a comparison result from the comparator means.

19. The output driver of claim 18, wherein the control means further comprises:
    a multiplexing means connected to provide a first reference voltage and a second reference voltage to the comparator means for the output line potential to be compared; and
    a voltage divider means for providing a plurality of reference voltages for selection by the multiplexing means.

20. The output driver of claim 19, wherein the multiplexing means includes an input connected to the input signal of the driver circuit, wherein the input signal is utilized to determine whether a high level or a low level is to be output by the driver circuit and wherein the multiplexer selects the first reference voltage and the second reference voltage supplied to the comparator unit based on the input signal.

* * * * *